(12) United States Patent
Rueckriem

(10) Patent No.: US 7,492,294 B2
(45) Date of Patent: Feb. 17, 2009

(54) RECEIVING METHOD WITH DIGITAL LEVEL ADJUSTMENT IN THE ANALOG SECTION AND INCREMENTAL LEVEL CHANGE IN THE DIGITAL SECTION

(75) Inventor: Reinhard Rueckriem, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/701,978

(22) Filed: Feb. 2, 2007

(65) Prior Publication Data

US 2007/0194959 A1 Aug. 23, 2007

(30) Foreign Application Priority Data

Feb. 3, 2006 (DE) .................. 10 2006 005 032

(51) Int. Cl.
  H03M 1/18 (2006.01)
  H04L 27/08 (2006.01)
(52) U.S. Cl. .................. 341/139; 375/260; 375/345; 370/347; 370/458
(58) Field of Classification Search .......... 341/139; 375/130, 219, 260, 295, 345; 370/278, 347
See application file for complete search history.

(56) References Cited

U.S. PATENT DOCUMENTS 4,213,097 A 7/1980 Chiu et al.
4,851,842 A * 7/1989 Iwamatsu .................. 341/139
5,808,575 A * 9/1998 Himeno et al. ............. 341/139
7,075,967 B2 * 7/2006 Struhsaker et al. ......... 375/260
7,085,334 B2 * 8/2006 Burke et al. ................ 375/345
7,174,190 B2 * 2/2007 Walker et al. .............. 455/557
2002/0186796 A1* 12/2002 McFarland et al. ......... 375/341

FOREIGN PATENT DOCUMENTS

DE 29 42 106 A1 5/1980
JP 62178017 A * 8/1987

* cited by examiner

Primary Examiner—Howard Williams
(74) Attorney, Agent, or Firm—Slater & Matsil, L.L.P.

(57) ABSTRACT

In an analog receiving section of a receiving device, the level of a received signal is adjusted by a first correction factor corresponding to a first digital level correction signal. Following this, the level-adjusted received signal is converted into a digital received signal. In a digital receiving section of the receiving device, the digital received signal is changed in accordance with a second digital level correction signal, in such a manner that a number of partial level adjustments are generated in successive time intervals in dependence on the level adjustment generated in the analog section. Thus, coarse level jumps produced in the analog receiving section can be split into individual small level jumps in the digital receiving section and stretched in time so that they can be processed in the subsequent demodulator.

16 Claims, 3 Drawing Sheets

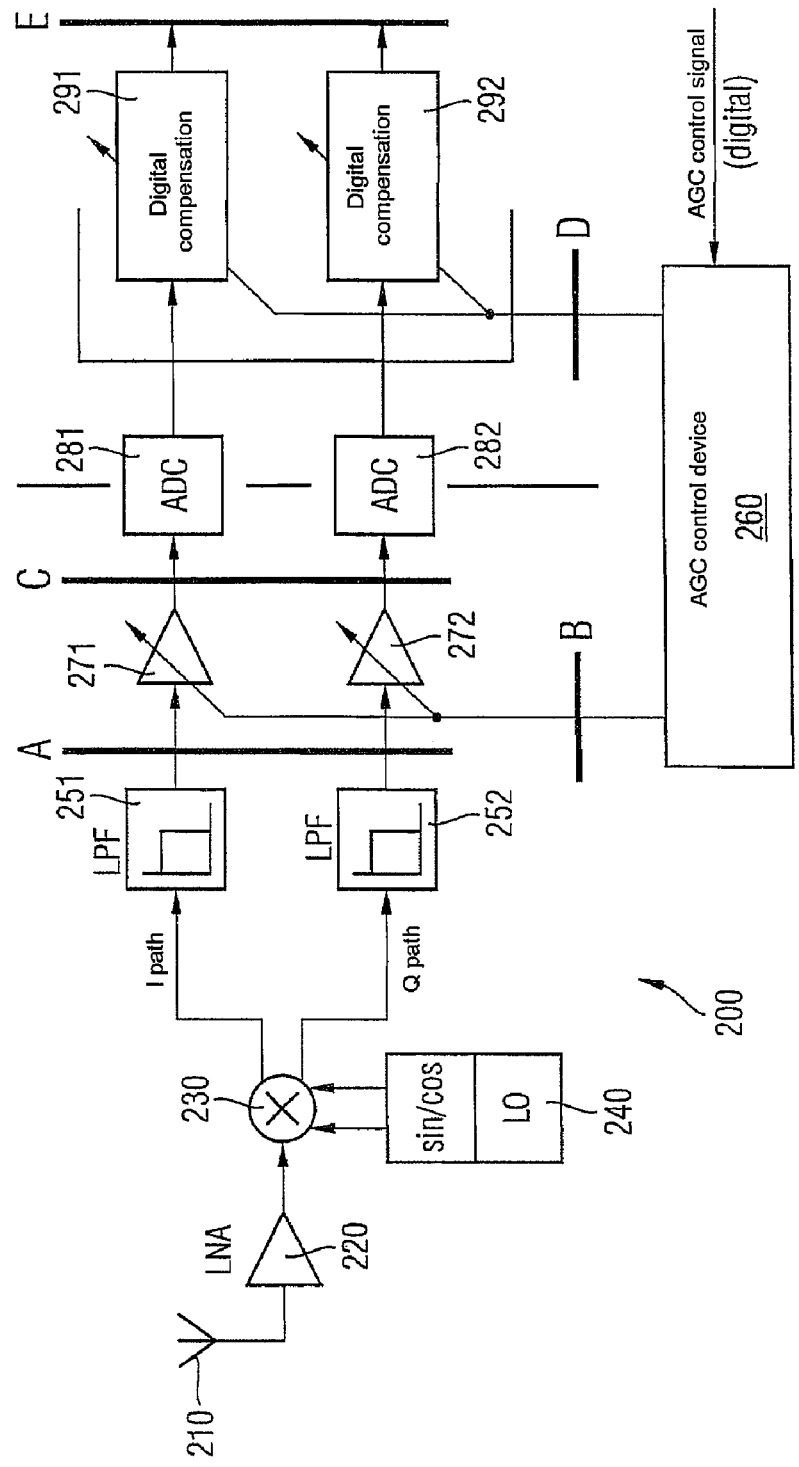

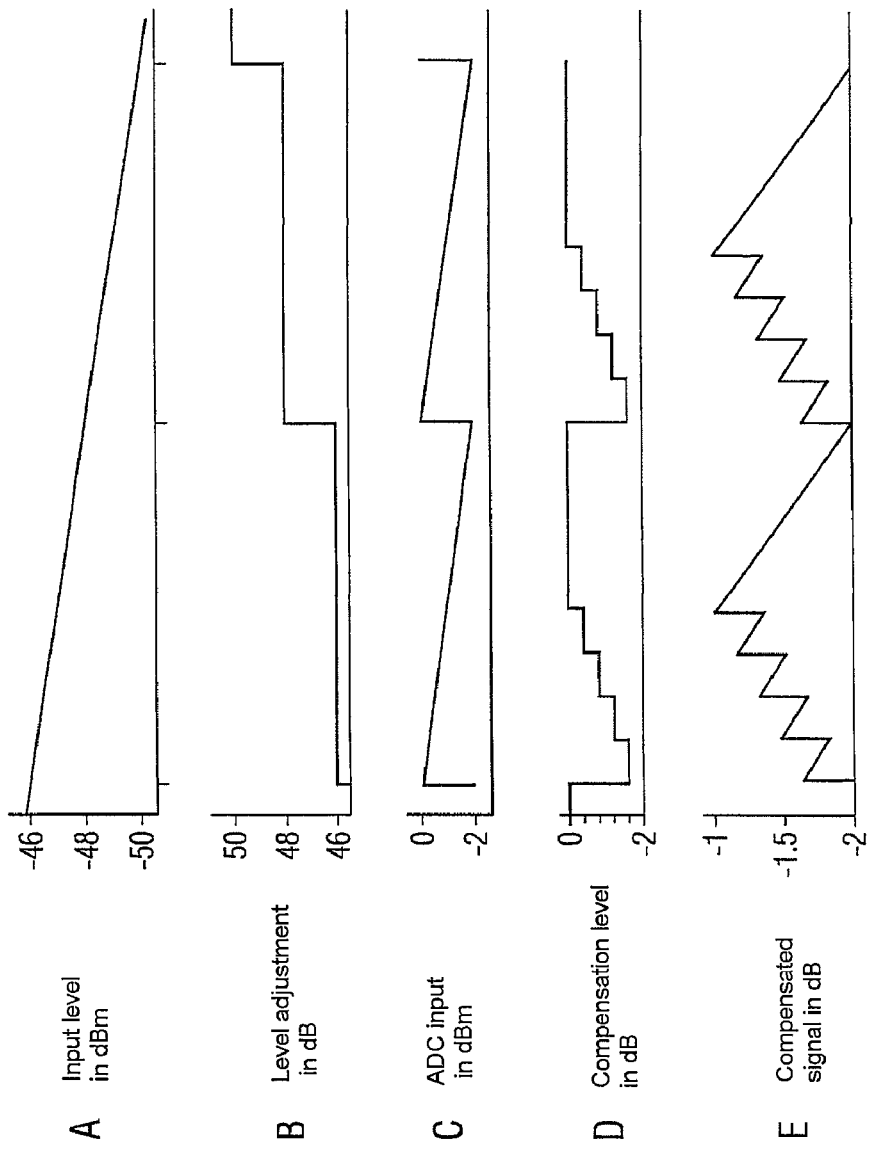

RECEIVING METHOD WITH DIGITAL LEVEL ADJUSTMENT IN THE ANALOG SECTION AND INCREMENTAL LEVEL CHANGE IN THE DIGITAL SECTION

This application claims priority to German Patent Application 10 2006 005 032.0, which was filed Feb. 3, 2006 and is incorporated herein by reference.

TECHNICAL FIELD

The present invention relates to a method for the automatic level adjustment of a received signal in a receiving device and a receiving device for carrying out the method.

BACKGROUND

FIG. 1 shows a simplified block diagram of a known, direct-mixing receiving device. This direct-mixing receiving device 100 has an analog receiver section and a digital receiver section. In the analog receiver section, an antenna 10 for receiving an analog, digitally modulated received signal is arranged at the input end. At the output end of the antenna 10, the received signal is supplied to a low-noise amplifier (LNA) 20. The received signal amplified by the low-noise amplifier 20 is supplied to a mixer 30 by means of which the received signal is mixed into the baseband. For this purpose, the mixer 30 is connected to a local oscillator 40 by means of which an oscillation having a frequency which corresponds to the carrier frequency of the received signal is generated and supplied to the mixer 30 in the form of two mutually orthogonal oscillations. The received signal is thus split by the mixer 30 into an I and a Q signal component. On the I path, the I component of the signal is first supplied to a first low-pass filter 51. The output signal of the first low-pass filter 51 is supplied to a first analog-controlled amplifier ($V_I$) 61. The output signal of the first amplifier 61 is supplied to a first analog/digital converter 71. The output signal of the first analog/digital converter 71 is supplied to the digital receiving section 80. The Q component of the output signal of the mixer 30 is supplied to a second low-pass filter 52. The output signal of the second low-pass filter 52 is supplied to a second analog-controlled amplifier ($V_Q$) 62. The output signal of the second amplifier 62 is supplied to a second analog/digital converter. The output signal of the second analog/digital converter 72 is also supplied to the digital receiving section 80.

For the receiving device, an analog gain control or level control (AGC, automatic gain control) is carried out. For this purpose, a received signal level is determined at a suitable place on the entire received-signal path, for instance by an RSSI measurement, and from this received signal level a control signal is generated. This control signal is supplied as analog level adjustment signal to the amplifiers 61 and 62.

The quality of the receiving characteristics of a direct-mixing amplifier is significantly dependent on the achievable symmetry between the I and Q path. A special problem is here the synchronism of the controllable amplifiers 61 and 62. As shown in FIG. 1, analog-controllable amplifiers 61 and 62 are used in the prior art, on the one hand. With increasing use of CMOS technology instead of bipolar technology as the basic circuit technology, however, the use of analog-controlled amplifiers becomes more and more expensive since the CMOS transistors cannot be produced with constantly good quality features with respect to one another to an adequate degree. This makes it difficult to achieve a synchronism of the amplifiers.

A further approach to a solution of the prior art is the use of digitally adjusted control amplifiers. In general, this results in very high requirements for the quantization of the digital corrupting variable (e.g., OFDM/QAM64 for DVB-T/H), depending on the type of modulation. If required or desired, the digital level control can be effected with a resolution within a range of tenths of dB. However, increased implementation expenditure is a disadvantage with digital level control.

SUMMARY OF THE INVENTION

In various embodiments, the present invention specifies a method and a device for automatic level adjustment of a received signal in a receiving device in which a low-expenditure digital automatic level adjustment is made possible.

As an example, the method according to embodiments of the invention for the automatic level adjustment of a received signal in a receiving device has steps a. to c. in which, in step a., the level of a received signal is adjusted by a first correction factor corresponding to a first digital level correction signal, in step b., the level-adjusted received signal is converted into a digital received signal, and in step c., the digital received signal is changed in accordance with a second digital level correction signal, in such a manner that a multiplicity of partial level adjustments (also called partial level steps in the text which follows) are generated in successive time intervals in dependence on the first digital level correction signal or the level adjustment generated by it in step a.

Embodiments of the present invention are based on a concept according to which the expenditure for implementing level control is to be shifted from the analog receiving section to the digital receiving section of the receiving device. In the analog receiving section, digital level adjustment is now only performed in relatively coarse jumps in order to save implementation expenditure. Instead, the jump in level arriving from the analog receiving section is split into a number of smaller successive level jumps in a digital receiving section of the receiving device. This reduces the correction effort in the analog receiving section and, instead, the coarse level jumps supplied are smoothed in time in the digital receiving section in which this is possible with relatively little expenditure.

The method according to the embodiments of the invention thus creates the basis for being able to achieve a synchronism of the level adjustment between the signal processing paths with supportable implementation expenditure in a receiving device which has a multiplicity of signal processing paths. This is achieved, on the one hand, by digitally controlled amplifiers in the individual signal processing paths and, on the other hand, by a synchronous level control in relatively large steps (macro steps) in the analog section which, after analog/digital conversion in the digital section, are split into successive, relatively small steps (micro steps) and are thus stretched in time.

In certain embodiments, the invention is related to mobile radio receivers, particularly direct-mixing mobile radio receivers and the I and Q signal processing paths contained therein. However, the invention is also related to methods and devices of all types in which a signal is split into two or more parallel signal processing paths for further processing and as synchronous as possible a gain or level control is carried out on these signal processing paths. As an example, audio signal processing can be considered here in which synchronism between right and left in stereo signal processing or generally between a number of audio signal paths is to be achieved.

Accordingly, the term receiving device is to be understood in a comprehensive sense and not only as a receiving device for receiving signals transmitted via an air interface. Instead, it is generally to be understood to be a signal processing device that receives and processes signals from another device.

In a particular embodiment, however, the invention is related to (mobile) radio receiving devices such as OFDM receivers or DVB-T/H receivers, particularly in the embodiment as a direct-mixing receiver. In these, the received signal is directly mixed into the baseband by a mixer and split into an in-phase branch and a quadrature branch in which the received signals are orthogonal to one another. Embodiments of the invention make it possible for the levels of the signals to be adjustable synchronously in the two signal paths.

A further application is related to, for example, audio signal processing devices in which splitting to two (stereo) or more signal processing paths can be carried out. In such devices, the invention provides for a synchronism of the level adjustments in the existing signal processing paths.

In method step c., the digital received signal is preferably initially adjusted in a first time interval by a second correction factor, the control adjustment of which is opposite to that of the first correction factor. Following this, the second correction factor is reduced incrementally down to a value 0 in the time intervals following the first time interval.

In the first time interval, the level jump of method step a. is preferably compensated to a level part-step so that as a result, the input signal of the first amplifier, with a level change by one level part-step, occurs at the output of the second amplifier in the first time interval. In the further time intervals, the second correction factor is reduced incrementally further and further so that, as a result, the level adjustment impressed in method step a. gains more and more in weight and in the last time interval, when the second correction factor assumes the value 0, finally completely dominates.

If thus a genuine signal amplification is carried out in method step a., this means that in method step c. a signal attenuation is carried out which opposes the signal amplification of method step a. in the first time interval and is incrementally reduced further and further down to the value 0 in the subsequent time interval so that finally the signal amplification predetermined by method step a. is no longer attenuated in the final time interval.

Conversely, it can also be provided that a signal attenuation is carried out in method step a. In this case, control is reversed in method step c. in such a manner that initially a signal amplification is carried out in the first time interval which counteracts the signal attenuation of method step a. and is incrementally reduced in the subsequent time intervals so that the predetermined signal attenuation reaches the output of the second amplifier uncorrupted in the second time interval.

It is preferably provided that in method step a., the level adjustment is automatically controlled in such a manner that a received signal level is determined and from this a control signal for generating the first digital level correction signal is generated. The received signal level can be determined, for example, by an RSSI measurement at a suitable place in the receiving device. The control signal is supplied in a manner known per se to a control device which, by comparing the control quantity with certain preset threshold values, generates as an output signal the first digital level correction signal by means of which the level of the received signal is then adjusted by the first correction factor.

If the receiving device is a device for receiving radio transmission data transmitted via an air interface, the analog received signal received by means of an antenna can be mixed with a frequency of a local oscillator and then split into an in-phase path and a quadrature path. In particular, the signal can be converted directly into the baseband. The synchronism of the two signal processing paths is ensured by the fact that, in method step a., the levels of the analog received signal in the I path and in the Q path can be adjusted on the basis of one and the same first digital level correction signal. The first digital level correction signal is a digital correction word which is supplied to a digitally adjustable amplifier. To provide synchronism, constructionally identical digitally controllable amplifiers must be used in the signal processing paths. The structure of such digitally adjustable amplifiers is known per se and does not need to be explained further at this point.

An advantage of the invention lies in the fact that, in method step a., the resolution of the digital automatic level adjustment can be reduced. It can be provided, e.g., that the first digital level correction signal output is only altered in steps of 0.5 dB or more. An upper limit is provided by the headroom of the analog/digital converter used. For the analog/digital converters, sigma/delta converters are increasingly used instead of the flash converters hitherto used. Sigma/delta converters make it possible to achieve a headroom of 20 dB so that a gradation of 10 dB would be possible in method step a. This drastically reduces the number of level correction processes so that the number of interfering transients generated by the correction processes is also reduced. Due to the lesser number of level steps, the circuit expenditure for the digitally adjustable amplifiers is also reduced.

In method step c., the digital received signals in the I path and in the Q path can be changed in constructionally identical digitally adjustable amplifiers in accordance with one and the same second digital level correction signal. As already explained above, the coarse adjustment steps of method step a. are here split into small level steps following one another in time.

If the received signal is subdivided into time slots, for instance as in the OFDM transmission method, it is possible, in method step c., to define the beginning and/or the end of a time interval in a predetermined temporal relation to the time slots or time slot boundaries of the received signal. In particular, if the received signal is a received OFDM signal, the beginning of a time interval can be placed at the beginning of a guard interval of the OFDM time slot structure.

The level correction processes are preferably dB-linear so that the relative level change is constant. Expressed in dB, the first and the second level correction factor always have reversed signs.

In another embodiment, a receiving device for carrying out the method contains an analog receiving section, at least one analog/digital converter and a digital receiving section, and at least one first amplifier in the analog receiving section, the gain of which can be adjusted by a first digital level correction signal, at least one second amplifier in the digital receiving section, the gain at which can be adjusted by a second digital level correction signal, and a control device for generating the first and second digital level correction signal.

If a radio receiving device for wireless communication systems is used as the receiving device, it can have a mixer in which a down-converted in-phase and quadrature component is generated from the analog received signal and supplied to two outputs. In the analog section of the receiving device, first amplifiers, which are in each case connected to a first output of the control device for supplying the first digital level correction signal, can be arranged in the I path and the Q path.

Furthermore, second amplifiers, which are in each case connected to a second output of the control device for supplying the second digital level correction signal, can be arranged in each case in the I path and the Q path in the digital section of the receiving device.

The control device can also have an input for supplying a control signal generated from a received signal level, such as an RSSI signal.

BRIEF DESCRIPTION OF THE DRAWINGS

In the text which follows, the invention will be explained in greater detail with reference to illustrative embodiments, in conjunction with the figures in which:

FIG. 2 shows a diagrammatic representation of a receiving device according to an illustrative embodiment of the invention as a radio receiving device; and FIG. 3 shows the variations with time of the signals occurring at points A-E of the receiving device of FIG. 2 (in dB).

DETAILED DESCRIPTION OF ILLUSTRATIVE EMBODIMENTS

Figure 1:
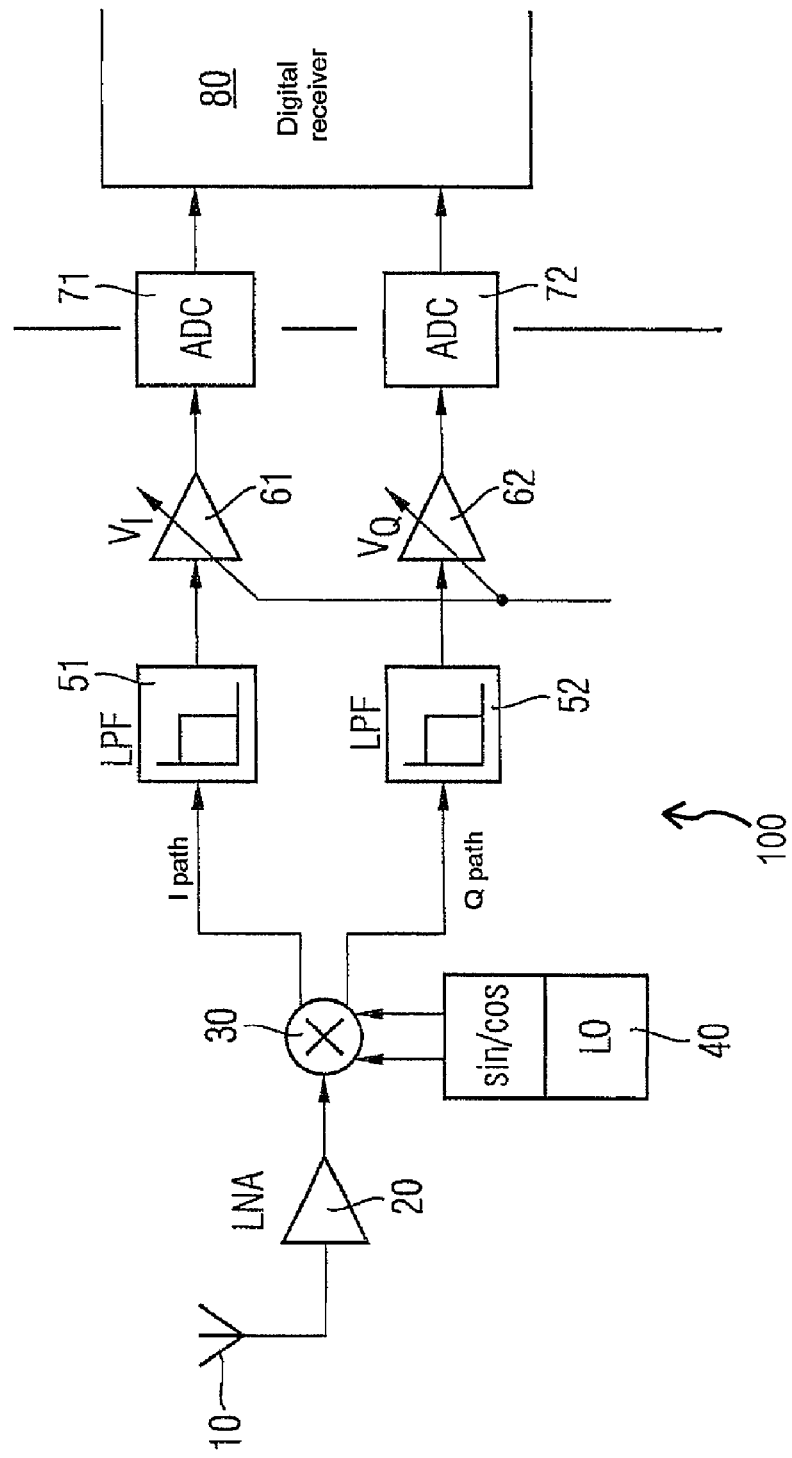
FIG. 1 shows a diagrammatic representation of a receiving device with automatic level control according to the prior art.

FIG. 2 diagrammatically shows a receiving device 200 for carrying out a method according to a first embodiment of the invention. A signal, for example an OFDM signal, is received via an antenna 210 and supplied to a low noise amplifier (LNA) 220. From the output of the low-noise amplifier 220, the signal is supplied to a mixer 230 in which the carrier-frequency received signal is mixed directly into the baseband. For this purpose, the mixer 230 is connected to a local oscillator 240 which supplies to the mixer 230 an in-phase component, and a quadrature component orthogonal thereto, of a carrier-frequency oscillation. The mixer 230 has two outputs and supplies an in-phase component of the signal converted into baseband at a first output and a quadrature component of the signal converted into baseband at a second output. The signals are then supplied to low-pass filters 251 and 252 in each of the two signal processing paths in order to cut off higher frequencies which are still present. The output of the low-pass filters 251 and 252 is identified by the letter A. FIG. 3A shows an illustrative variation of a signal in time at this point. It is assumed that the signal decreases dB-linearly at position A.

At a suitable point in the receiving device, a received signal level is determined, for example in the form of an RSSI measurement, and from this a digital control signal is generated which is supplied to an AGC control unit 260. If the input level drops below certain threshold values, the control system causes a new digital level correction signal to be output by the AGC control device 260. This digital level correction signal is identified by the point B in FIG. 2 and is correspondingly shown in the selected illustrative embodiment as timing diagram in FIG. 3. In the selected illustrative embodiment, control with a resolution of 2 dB is provided so that a new digital level correction signal producing a gain of 2 dB is generated when the input level decreases by 2 dB. The digital level correction signal is supplied to first amplifiers 271 and 272 which are in each case arranged in the I path and the Q path of the analog section of the receiving device 200. In the present illustrative embodiment, the level adjustment is a genuine amplification since the dropping received signal level must be counteracted. The output signal of the amplifiers 271 and 272 is designated by the letter C and shown in the form of a timing diagram in FIG. 3C. The selective resolution of the automatic level control is 2 dB. Naturally, either a slightly higher resolution, for instance with 0.5 dB, or an even lower resolution, for instance with 3 dB, can be provided depending on the desired expenditure of implementation. The least possible resolution is predetermined by the headroom of the analog/digital converters 281 and 282. If this is 20 dB, for example, the resolution can also be only 10 dB, theoretically. In the case of the selected illustrative embodiment of 2 dB resolution, the digital demodulator connected following point E in the digital section of the receiving device is not capable of faultlessly processing a jump in level of 2 dB, particularly with modulation methods such as QAM 64, so that splitting this level jump is also advantageous from this aspect.

In the I and Q signal processing paths, analog/digital converters 281 and 282 are in each case arranged by means of which the analog signals are converted into digital signals. The outputs of the A/D converters 281 and 282 are connected to the digital section of the receiving device. The latter contains second amplifiers 291 and 292 in which the splitting of the level step into level part-steps according to the invention is carried out during time intervals. The output of A/D converter 281 is connected to the input of amplifier 291, whereas the output of A/D converter 282 is connected to the input of amplifier 292. In the AGC control device 260, a second digital level correction signal is generated and delivered to the two amplifiers 291 and 292 in order to change the digital received signal in the desired manner. The second digital level correction signal is present at point D of the circuit of FIG. 2 and is shown in its timing relationship according to FIG. 3D. Each individual level part-step has an amplitude of 0.4 dB. In the first time interval, a level correction step is first generated which is opposite to the level adjustment previously performed in the analog section, wherein the amount of one level part-step is already subtracted during the first time interval. Since in the present illustrative embodiment, an amplification of 2 dB (first correction factor +2 dB) was generated in the analog section, an attenuation by −1.6 dB (second correction factor −1.6 dB) is carried out in the first time interval in the digital section. In the subsequent time intervals, this attenuation is reduced incrementally down to the value 0 by level part-steps of 0.4 dB amplitude. Combining the level adjustments of the two first amplifiers 251 and 252 and the two second amplifiers 291 and 292 thus results in an amplification which rises to a value of 2 dB in steps of 0.4 dB in accordance with the time intervals shown in FIG. 3D in order to thus counteract the drop in received signal level at point A. The output signal of the second amplifiers 291 and 292 at point E is shown in FIG. 3E in the timing diagram.

The step amplitude in method step c. and the length of the time intervals are selected by the control device 260 as determined by the characteristics of the channel. In the case of a rapidly changing channel, the level change in the digital section, i.e., the reduction of the second digital level correction signal to the value 0 dB occurs relatively rapidly, whereas in the case of a steady-state channel, the level change follows correspondingly slowly. It can be provided that, in the control device 260, a table is set up in which the length of the time intervals, the amplitude of the level part-steps and the number of time intervals for level part-steps can be selected in dependence on certain channel parameters.

In the text which follows, two further illustrative embodiments for carrying out the method according to embodiments of the invention are represented numerically by means of the voltage levels (in mV) and dB values.

The following parameters and constants apply to these two examples:

| | | | | |
|---|---|---|---|---|
| Input level 100 (e.g. in mV) | | | | |
| AGC step 1 dB (rise = 1.122, fall = 0.8913) | | | | |
| Number of microsteps = 3 | | | | |
| Level steps: | 0.25 | 0.50 | 0.75 | dB |
| Coefficient increment: | 1.0292 | 1.0593 | 1.0902 | |
| Coefficient decrement: | 0.9716 | 0.9441 | 0.9173 | |

EXAMPLE 1

AGC Level Adjustment Amplifies the Level by 1 dB

Phase 1 (before level readjustment)
Input level is 100
Output level is 100
Phase 2 (AGC level adjustment increases the level by 1 dB)
Input signal is 100·1.122=112.2→signal at the output of the analog section
Task for step compensation: generate a gentle transition from 100 to 112.2
Step compensation
Microstep 1
Compensation level −0.75 dB (0.9173)
Output=112.2·0.9173=102.92
Microstep 2
Compensation level −0.5 dB (0.9441)
Output=112.2·0.9441=105.93
Microstep 3
Compensation level −0.25 dB (0.9716)
Output=112.2·0.9716=109.01
Final step
Compensation level 0.0 dB (1.0)
Output=112.2·1.0=112.2
As a result, the following level sequence is thus generated at the output of the compensator:

| | |
|---|---|
| 100 | before the step |
| 102.92 | after the first step |
| 105.93 | after the second step |
| 109.01 | after the third step |
| 112.2 | final result |

A gentle transition is thus provided between 100 and 112.2.

EXAMPLE 2

AGC Level Adjustment Reduces the Level by 1 dB

Phase 1 (before the AGC level readjustment)
Input signal is 100
Output signal is 100
Phase 2 (AGC level adjustment reduces the level by 1 dB)
Input signal is 100·0.8913=89.13→signal at the output of the analog section
Task for step compensation:
Generate gentle transition from 100 to 89.13
Step compensation
Microstep 1
Compensation level +0.75 dB (1.0902)
Output=89.13·1.0902=97.17
Microstep 2
Compensation level +0.5 dB (1.0593)
Output=89.13·1.0593=94.42
Microstep 3
Compensation level +0.25 dB (1.0292)
Output=89.13·1.0292=91.73
Final step (MUX is switched back for through conduction)
Compensation level 0.0 dB=1.0
Output=89.13·1.0=89.13
As a result, the following level sequence is thus generated at the output of the compensator:

| | |
|---|---|
| 100 | before the step |
| 97.17 | after the first step |
| 94.42 | after the second step |
| 91.73 | after the third step |
| 89.13 | final result |

As a result, a gentle transition is achieved between 100 and 89.13.

What is claimed is:

1. A method for the automatic level adjustment of a received OFDM signal in a receiving device, said received OFDM signal being subdivided with time slots, the method comprising:
adjusting a level of said received OFDM signal by a first correction factor corresponding to a first digital level correction signal in an analog receiving section of the receiving device;
converting the level-adjusted received signal into a digital received signal; and
in a digital receiving section of the receiving device, changing the digital received signal in accordance with a second digital level correction signal, in such a manner that a multiplicity of partial level adjustments is generated in successive time intervals in dependence on the first digital level correction signal, and whereas the beginning of a time interval is placed at the beginning of a guard interval of the OFDM time slot structure.

2. The method according to claim 1, wherein changing the digital received signal comprises:
adjusting the digital received signal in a first time interval by a second correction factor, the level adjustment of which is opposite to that of the first correction factor; and
in the time intervals following the first time interval, incrementally reducing the second correction factor down to a value of 0.

3. The method according to claim 1, wherein the received signal level is determined and a control signal for generating the first digital level correction signal is generated from the determined received signal level.

4. The method according to claim 1, wherein received signal comprises an analog received signal that is mixed with a frequency of a local oscillator and then split into an in-phase path (I) and a quadrature path (Q).

5. The method according to claim 4, wherein adjusting the level of the received signal comprises adjusting levels of the analog received signal in the I path and in the Q path on the basis of one and the same first digital level correction signal.

6. The method according to claim 4, wherein changing the digital received signal comprises changing the digital received signals in the I path and in the Q path in accordance with one and the same second digital level correction signal.

7. The method according to claim 4, wherein the received signal is converted directly into the baseband.

8. A device for receiving an OFDM signal that is subdivided into time slots comprising:
an analog receiving section for receiving said OFDM signal, said analog receiving section including at least one first amplifier with a gain that can be adjusted by a first digital level correction signal;

at least one analog/digital converter with an input coupled to the analog receiving section;

a digital receiving section with an input coupled to the analog/digital converter, the digital receiving section including at least one second amplifier with a gain that can be adjusted by a second digital level correction signal; and a control device for generating the first digital level correction and the second digital level correction signal, said second digital level correction signal changing a digital received signal in such a manner that a multiplicity of partial level adjustments are generated in successive time intervals depending on the first digital level correction signal such that the beginning of a time interval is placed at the beginning of a guard interval of the OFDM time slot structure.

9. The receiving device according to claim 8, wherein the analog receiving section further comprises a mixer with an output coupled to an in-phase path (I) and to a quadrature path (Q).

10. The receiving device according to claim 9, further comprising two first amplifiers coupled between the analog receiving section and the analog/digital converter, one of the first amplifiers being arranged in the I path and the other of the first amplifiers being arranged in the Q path, wherein the two first amplifiers are coupled to a first output of the control device for supplying the first digital level correction signal.

11. The receiving device according to claim 10, further comprising two second amplifiers, one of the second amplifiers being arranged in the I path and the other one of the second amplifiers being arranged in the Q path, the two second amplifiers being coupled to a second output of the control device for supplying the second digital level correction signal.

12. The receiving device according to claim 8, wherein the control device has an input for supplying a control signal generated from a received signal level.

13. The receiving device according to claim 8, wherein the receiving device comprises a direct-conversion receiving device.

14. The receiving device according to claim 8, wherein the receiving device performs an automatic level adjustment of a received signal in a receiving device, wherein:

the level of a received signal is adjusted by a first correction factor corresponding to the first digital level correction signal in the analog receiving section of the receiving device;

the level-adjusted received signal is converted into a digital received signal; and in the digital receiving section, the digital received signal is changed in accordance with the second digital level correction signal, in such a manner that a multiplicity of partial level adjustments are generated in successive time intervals in dependence on the first digital level correction signal.

15. A device for receiving an OFDM signal that is subdivided into time slots comprising:

means for adjusting a level of a received signal by a first correction factor corresponding to a first digital level correction signal in an analog receiving section of the receiving device;

means for converting the level-adjusted received signal into a digital received signal; and means for changing the digital received signal in accordance with a second digital level correction signal, in such a manner that a multiplicity of partial level adjustments are generated in successive time intervals in dependence on the first digital level correction signal such that the beginning of a time interval is placed at the beginning of a guard interval of the OFDM time slot structure.

16. The receiving device according to claim 15, wherein received signal comprises an analog received signal that is mixed with a frequency of a local oscillator and then split into an in-phase path (I) and a quadrature path (Q).

* * * * *